US00RE35854E

United States Patent [19]

Pezzani et al.

[11] E Patent Number: Re. 35,854

[45] Reissued Date of Patent: Jul. 21, 1998

[54] PROGRAMMABLE PROTECTION CIRCUIT AND ITS MONOLITHIC MANUFACTURING

[75] Inventors: Robert Pezzani, Vouvray; Eric Bernier, Mettray, both of France

[73] Assignee: SGS-Thomson Microelectronics, S.A., Gentilly, France

[21] Appl. No.: 407,976

[22] Filed: Mar. 22, 1995

Related U.S. Patent Documents

Reissue of:

[64] Patent No.: 5,274,524
Issued: Dec. 28, 1993
Appl. No.: 801,780
Filed: Dec. 6, 1991

[51] Int. Cl.[6] ..... H02H 3/20; H02H 9/00

[52] U.S. Cl. ..... 361/56; 361/111; 361/119

[58] Field of Search ..... 361/56, 91, 111, 361/118, 119

[56] References Cited

U.S. PATENT DOCUMENTS

| | | | |
|---|---|---|---|
| 4,282,555 | 8/1981 | Svedberg | 361/56 |
| 4,390,919 | 6/1983 | Lesinski | 361/56 |
| 4,695,916 | 9/1987 | Satoh et al. | 361/56 |
| 5,274,524 | 12/1993 | Pezzani et al. | 361/56 |
| 5,293,112 | 3/1994 | Takahashi | 323/315 |
| 5,349,286 | 9/1994 | Marshall et al. | 323/315 |

FOREIGN PATENT DOCUMENTS

| | | | |
|---|---|---|---|
| 2218872 | 11/1989 | United Kingdom | H02H 1/04 |
| 2225908 | 6/1990 | United Kingdom | H02H 9/04 |

OTHER PUBLICATIONS

"A Switching Regulator and Lightning Protector for a Subscriber Line Interface Circuit," Chen, R.K.; Lerch, T.H., Spires, D.A. IEEE Journal of Solid–State Circuits, vol. SC–21, No. 6, p. 947 (1986).

"A Solid–State Solution (Thyristors for CO Surge Protection)," Thrasher, M. Telephony, vol. 216, No. 24, p. 46 (1989).

"Protection of Subscriber Line Interface Circuits, " Kobayashi, T., Endo, H. NEC Research and Development, No. 86, p. 81 (1987).

"Thyristor Structures for Lightning Protection in Telecommunications," Maytum, M.J. Lightning Protection Seminar Proceedings (ERA Report).

"A Programmable Lightning Protector for Subscriber Line Interface Circuit (SLIC)," Pezzani, R.; Bernier, E.; Bremond, A. EPE–MADEP Symposium on Materials and Devices (1991).

"Breakover Diodes for Protection of Telephone Equipment," Haslam, D.F.; Hill, M.J. Electronic Componenets and Applications, vol. 8, No. 2, p. 81 (1987).

"Protection of Subscriber Equipment Against Transient Line Voltages," Feuell, E.A. Telecommunications, vol. 10, No. 9, p. 55 (1976).

"Lighting Surge Protection Design for Subscriber Line Interface Circuits in D70 Digital Switching System," Deguchi, F.; Yamada, H. Review of the Electrical Communication Laboratories, vol. 33, No. 2, p. 332, (1985).

*Primary Examiner*—Jeffrey A. Gaffin
*Assistant Examiner*—Stephen W. Jackson
*Attorney, Agent, or Firm*—Richard A. Bachand; Theodore E. Galanthay; Lisa K. Jorgenson

[57] ABSTRACT

A programmable protection circuit comprises three identical units connected between a common point (C) and a first conductor (A), a second conductor (B) and ground (M). Each unit comprises the anti-parallel arrangement of a thyristor (T) and a diode (D), a bipolar transistor (TR) being connected between the gate and anode of the thyristor, the anodes of the thyristors being connected to the common point and the base terminal of each unit constituting a programmation terminal and being connected to a device defining a voltage threshold. Each device defining a voltage threshold is a zener diode (Z1, Z2, Z3) connected between each base terminal and the common point.

31 Claims, 2 Drawing Sheets

PROGRAMMABLE PROTECTION CIRCUIT AND ITS MONOLITHIC MANUFACTURING

Matter enclosed in heavy brackets [ ] appears in the original patent but forms no part of this reissue specification; matter printed in italics indicates the additions made by reissue.

BACKGROUND OF THE INVENTION

The present invention relates to the field of overvoltage protection circuits.

Among overvoltage protection circuits, one knows, for example from U.S. Pat. No. 4,282,555, circuits as shown in FIG. 1 wherein three unidirectional protection units 1, 2 and 3 are connected between a common point C and a first line A, a second line B and ground M. Each protection component comprises a non-parallel unidirectional protection component P and a diode D, respectively P1, D1; P2, D2; P3, D3. The electrodes of same nature (anode or cathode) of the various components are connected at point C.

The protection components P1, P2, P3 are, for example, gateless thyristors which become conductive from their anode to their cathode when the voltage across their terminals exceeds a threshold value determied during manufacturing.

An advantage of the circuit of FIG. 1 is that the three units can be integrated on a single chip.

However, whenever the advantageous solution of monolithically integrating the three protection units is selected, as a result, for technical reasons, the breakdown voltages of the three protection units P1, P2, P3 are identical and will increase with the temperature of the unit, heating being liable to be caused by a long-time overvoltage or by short-time and recurrent overvoltages.

On the other hand, some circuits are entirely achieved as discrete circuits which are costly and cumbersome and are designed only for the protection of one phase, as described in French patent FR-A-70 17172.

Thus, an object of the invention is to provide a protection circuit which gets rid of the drawbacks of the fully integrated circuits, that is, wherein, on the one hand, the protection voltage of each component is adjustable independently of that of the other components and, on the other hand, the protection voltage is independent of temperature, and is not so costly as discrete circuits.

SUMMARY OF THE INVENTION

To achieve these objects and others, the invention provides a programmable protection circuit for a line comprising three identical units connected between a common point and a first conductor, a second conductor and ground, wherein the three units are achieved in a single monolithic integrated circuit, each unit comprising a non-parallel association of a thyristor and a diode, a bipolar transistor being connected between the gate and anode of the thyristor, the anodes of the thyristors being connected to the common point and the base terminal of each unit constituting a programmation terminal and being connected to a device external to the integrated circuit defining a threshold voltage.

According to an embodiment of the invention, the device defining a voltage threshold is a zener diode connected between each base terminal and the common point.

The invention further provides a monolithic component associating three protection units each comprising a thyristor and a diode in a non-parallel arrangement, a transistor being connected between the gate and the anode of each thyristor, the anodes of the thyristors being connected to a common terminal corresponding to the rear surface of the monolithic component, the component being made on an N-type substrate. Each thyristor successively comprises, from its anode to its cathode, an N-type anode region, a first P-type well, the substrate, and a P-type region in contact with the metallization of the rear surface. Each diode is vertically constituted by the first well, the substrate and an N-type region in contact with the rear surface. Each transistor is constituted by a second P-type well wherein is formed an emitter region, the substrate and an N-type rear surface region constituting the collector. A first metallization is fixed to the transistor base and corresponds to the control electrode, a second metallization connects the transistor emitter to the anode gate region of the thyristor, and a third metallization coats the cathode region of the thyristor and the adjacent well and corresponds to the diode anode.

BRIEF DESCRIPTION OF THE DRAWINGS

The foregoing and other objects, features and advantages of the invention will be apparent from the following detailed description of preferred embodiments as illustrated in the accompanying figures wherein.

DETAILED DESCRIPTION OF THE INVENTION

Figure 1:
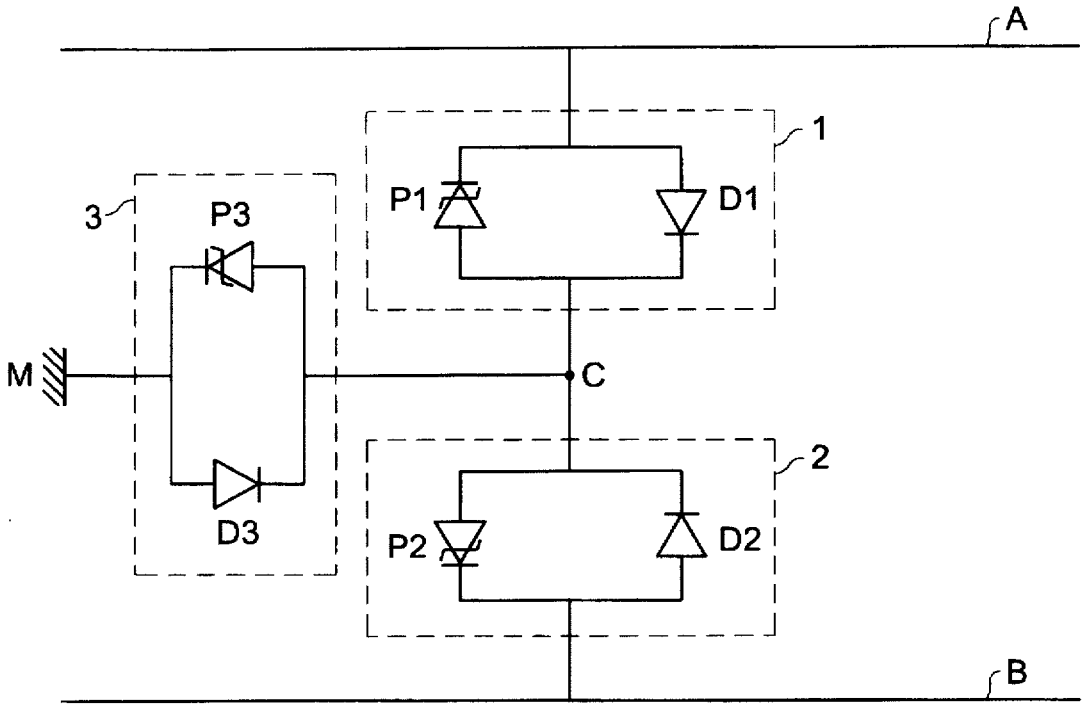
FIG. 1, above described, illustrates the state of the art.
Figure 2:
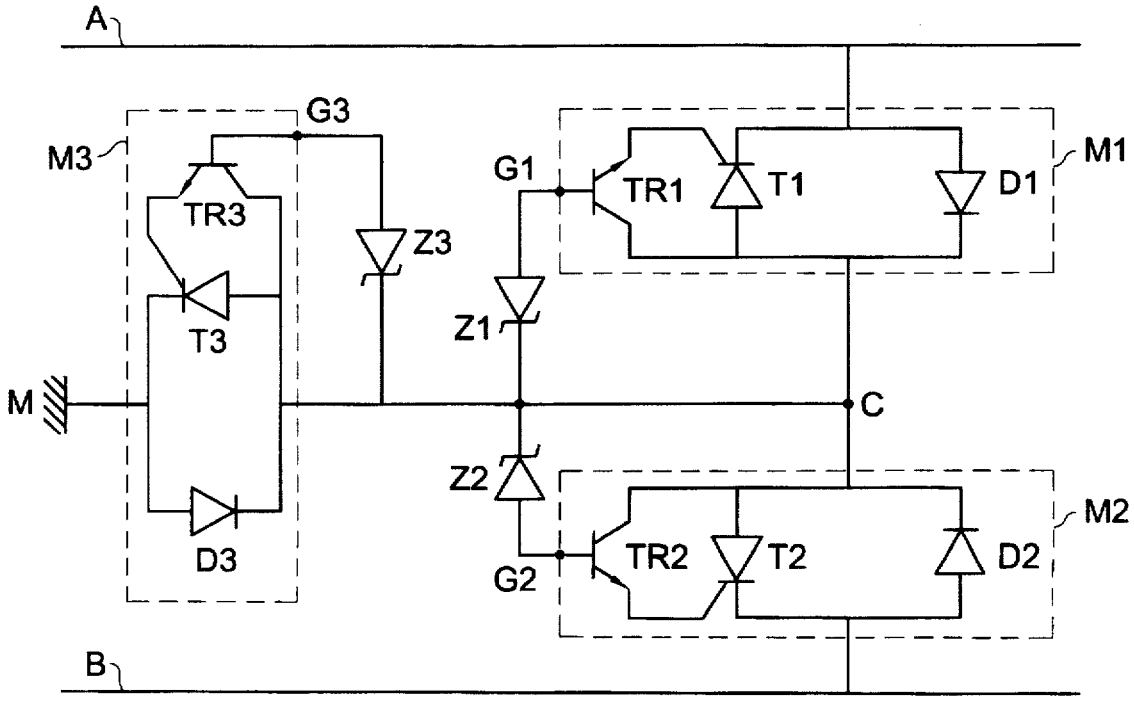
FIG. 2 shows a programmable protection circuit according to the invention.

As shown in FIG. 2, a circuit according to the invention comprises three units M1, M2, and M3, each of which is constituted by the non-parallel association of a thyristor T and a diode D. Each unit also comprises an NPN transistor TR, the emitter of which is connected to the terminal of the thyristor gate and the collector of which is connected to the thyristor anode. The transistor base corresponds to the control terminal G of the unit. In the figure, the elements of unit M1 are referenced with index 1, the elements of unit M2 with index 2 and the elements of unit M3 with index 3.

It can be considered that, in each unit, the assembly of a thyristor and a transistor constitutes a thyristor of the gate amplification type. Such a thyristor only needs a low control current to be conductive while maintaining satisfactory breakdown voltage and hold current characteristics.

Due to the fact that a low control current is sufficient for triggering each thyristor, the control terminals G of each unit can be connected to the anode of a zener diode, the other terminal of which is connected to the common point C. Since the current is low, the zener diodes, which are external to the circuit incorporating the units, will not tend to heat and well defined protection voltages can be set for each unit M1, M2, M3. Units M1 and M2 having relatively symmetrical functions, a same breakdown voltage can be chosen for zener diodes Z1 and Z2 and possibly a different breakdown voltage for zener diode Z3. However, it will be possible, for specific cases, to select different breakdown voltages for zener diodes Z1 and Z2, as a function of the application to be carried out.

Figure 3:
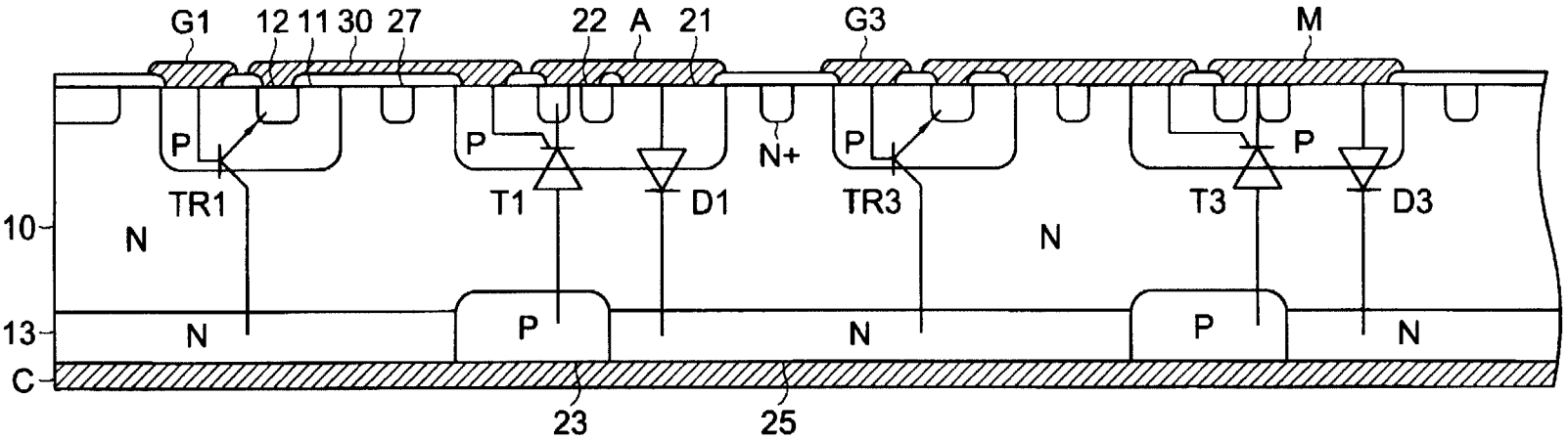
FIG. 3 shows an embodiment of the circuit according to the invention.

FIG. 3 shows a monolithic association embodiment of the units. More precisely, the figure shows, to facilitate the legibility of the drawing, the monolithic association of units M1 and M3 only. However, it is apparent that unit M2, which is identical to units M1 and M3, can also be formed on the same chip. FIG. 3 is a very schematic cross-section drawing but is sufficiently clear for those skilled in the art of semiconductor components and who know the thicknesses of the layers conventionally obtained through diffusion and the lateral dimensions to choose for each element as a function, especially, of the power requirements. Those skilled in the art also know the doping levels useful for the operation of each component and the choice to make for obtaining on a same chip, through a minimum number of diffusion steps, doping levels compatible for various components.

The left-hand portion of FIG. 3 shows unit M1 and the right-hand portion unit M3. Unit M1 only will be described, the other units being identical.

The monolithic structure is formed from a low doped N-type silicon substrate 10. The rear surface of the substrate is coated with a metallization C corresponding to the common point C of FIG. 2. Components TR1, T1, D1 have a vertical structure.

The base of transistor TR1 corresponds to a P well 11 disposed on the side of the front or upper surface of the substrate and wherein is formed an N-type emitter region 12. The collector of transistor TR1 corresponds to substrate 10 and to an N-type overdoped region 13 on the side of the rear surface of the substrate.

The cathode gate region of thyristor T1 corresponds to a P well 21 wherein is formed an N region 22, generally provided with emitter shortings. Thus, the thyristor comprises, from its cathode to its anode, layer 22, well 21, substrate 10 and a more doped P-type layer 23 in contact with metallization C.

Diode D1 is constituted by the P well 21, the substrate 10 and an overdoped N-type region 25.

It will be noted that in this structure, the various units and various unit components are not insulated one from the other by deep diffusion regions. However, it is preferable to provide N+-type stop-channel regions 27 between the various P wells.

As regards the front surface metallizations, they are shown by hatched regions in contact with semiconductive regions or portions of an isolating layer, not referenced, generally made of silicon oxide. A metallization G1 in contact with the P well 11 corresponds to the control terminal G1 of unit M1. A connecting metallization 30 connects the emitter 12 of transistor TR1 to the cathode gate region 21 of thyristor T1. Last, a metallization coating the cathode layer 22 and the apparent surface of well 21 is designed to be connected to line A and corresponds to the cathode of transistor T1 and the node of diode D1.

Figure 5:
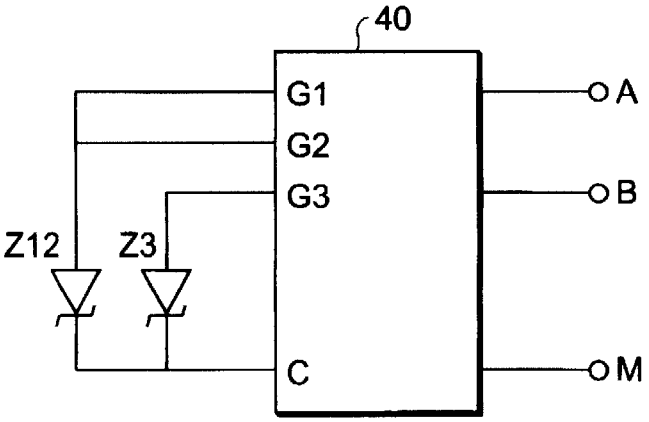
FIGS. 4 and 5 show various set up using the monolithic circuit according to the invention.
Figure 4:
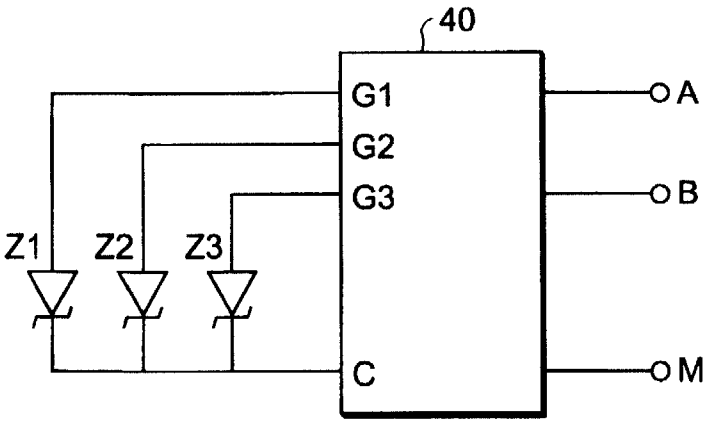

FIGS. 4 and 5 represent the monolithic structure of FIG. 3 as a block 40 comprising terminals G1, G2, G3 and C intended to be connected to various zener diodes and terminals A, B and M intended to be connected to line A, line B and ground. FIG. 4 corresponds to FIG. 2. In FIG. 5, it is shown that a single diode Z12 can be used for replacing diodes Z1 and Z2 when it is not desired to differently program the protection voltages of units M1 and M2. It could even be possible to provide a single diode connected to the three terminals G1, G2, G3.

The invention is liable of various variants and modifications which will appear to those skilled in the art. For example, the gate amplification transistors TR could be replaced by gate amplification thyristors. This can be simply carried out in the exemplary monolithic structure of FIG. 3 by replacing the N-type layer 13 by a P-type layer.

On the other hand, an embodiment of the invention is described above, wherein the break-over voltages are determined by zener diodes. It could also be possible, for programmation voltages ranging from 0 to 150 V, to apply an external battery voltage directly to terminals G1, G2 and G3. The programmed break-over voltage would then be defined by the breakdown voltage of the emitter-base junction of transistors TR1, TR2, TR3.

We claim:

1. A programmable protection circuit for signal lines comprising:

a) a monolithic integrated circuit having three identical units connected between a common point and a first conductor of the signal lines, a second conductor of the signal lines and ground, each unit comprising:

i) an anti-parallel association of a thyristor and a diode, said thyristor having an anode and a gate, and said anode being connected to the common point, and ii) a transistor connected between said anode and said gate; and b) means, external to said monolithic integrated circuit and coupled to each base terminal of said transistor of each unit, for defining a voltage threshold of each unit of said programmable protection circuit.

2. A programmable protection circuit according to claim 4, wherein said voltage threshold defining means comprises a zener diode connected between each base terminal of each unit and said common point so that said three identical units have the same voltage threshold.

3. The programmable protection circuit of claim 1, wherein said voltage threshold defining means comprises a plurality of zener diodes and each one of said plurality of zener diodes is connected between each base terminal of each unit and the common point so that said three identical units have the same or different voltage thresholds.

4. The programmable protection circuit of claim 1, wherein said voltage threshold defining means comprises a plurality of zener diodes, one of said plurality of zener diodes being connected between base terminals of two of said three identical units and the common point, and another one of said plurality of zener diodes being connected between the base terminal of a remaining unit of said three identical units and the common point, whereby said two of said three identical units have a first voltage threshold and said remaining identical unit has a second voltage threshold.

5. The programmable protection circuit of claim 1, wherein said monolithic integrated circuit is formed in a semiconductor substrate having a common metallization layer formed on a rear surface of said semiconductor substrate to define the common point, and each thyristor of said three identical units comprises first, second, third and fourth semiconductor regions formed in said semiconductor substrate, every odd semiconductor region of a first conductivity type, every even semiconductor region of a second conductivity type and said fourth semiconductor region being in contact with said common metallization layer.

6. The programmable protection circuit of claim 5, wherein each diode of said three identical units comprises at least two semiconductor regions of opposite conductivity types formed in said semiconductor substrate, one of said at least two semiconductor regions being in contact with said common metallization layer.

7. The programmable protection circuit of claim 6, wherein each transistor of said three identical units comprises first, second, third and fourth semiconductor regions formed in said substrate, said first, third and fourth semiconductor regions of a first conductivity type, said second semiconductor regions of a second conductivity type and said fourth semiconductor region being in contact with said common metallization layer.

8. The programmable protection circuit of claim 7, wherein a first metallization layer is formed on a top surface of said semiconductor substrate and in contact with said second semiconductor region of said transistor to connect said base terminal of each transistor of said three identical units to said voltage threshold defining means external to said monolithic integrated circuit.

9. The programmable protection circuit of claim 8, wherein a second metallization layer is formed on the top surface of said semiconductor substrate to connect said first semiconductor region of said transistor to said second semiconductor region of said thyristor.

10. The programmable protection circuit of claim 9, wherein a third metallization layer is formed on the top surface to connect said first semiconductor region of said thyristor to another one of said at least two semiconductor regions of said diode.

11. The programmable protection circuit of claim 7, wherein said first conductivity type is N-type, and said second conductivity is P-type.

12. The programmable protection circuit of claim 1, wherein said monolithic integrated circuit is made from an N-type substrate, each thyristor comprising an N-type cathode region, a first P-type well in the cathode region, said N-type substrate and a P-type region in contact with a common metallization formed on a rear surface of said N-type substrate, each diode comprising said first P-type well, said N-type substrate and an N-type region in contact with said common metallization, each transistor comprising a second P-type well with an N-type emitter region formed therein, said substrate and a second N-type region in contact with said common metallization, a first metallization being fixed to said second P-type well of said transistor and corresponding to said base terminal for connection to said voltage threshold defining means, a second metallization connecting said N-type emitter region of said transistor to said first P-type well constituting a gate region of said thyristor, and a third metallization connecting sad N-type cathode region of said thyristor to said first P-type well constituting an anode of said diode.

*13. A programmable line protection component, comprising:*

*an anti-parallel association of a thyristor and a diode, said thyristor having an anode, a cathode, and a gate, and*

*a transistor having first and second current-carrying terminals thereof connected between said anode and said gate, and also having a control terminal,*

*said thyristor, diode, and transistor all being integrated together in a common solid-state structure; and*

*a voltage thresholding component connected between said control terminal of said transistor and said anode of said thyristor.*

*14. The component of claim 13, wherein said cathode of said thyristor is directly connected to the line to be protected.*

*15. The component of claim 13, wherein said voltage thresholding component is external to said solid-state structure.*

*16. The component of claim 13, wherein said voltage thresholding component is a diode with a fixed breakdown voltage.*

*17. A programmable line protection circuit, comprising:*

*a plurality of protection components, each comprising:*

*an anti-parallel association of a thyristor and a diode, said thyristor having an anode, a cathode, and a gate, and*

*a transistor having first and second current-carrying terminals thereof connected between said anode and said gate, and also having a control terminal,*

*said thyristor, diode, and transistor all being integrated together in a common solid-state structure; and*

*a voltage thresholding component connected between said control terminal of said transistor and said anode of said thyristor;*

*said protection components being connected back-to-back between two separate signal lines.*

*18. The circuit of claim 17, wherein each said voltage thresholding component is a diode with a fixed breakdown voltage.*

*19. The circuit of claim 17, wherein said anodes of said thyristors, and the cathodes of said diodes, are all connected together at a common point.*

*20. The circuit of claim 17, wherein said voltage thresholding components have equal breakdown voltages.*

*21. The circuit of claim 17, wherein said voltage thresholding components have unequal breakdown voltages.*

*22. The circuit of claim 17, wherein said protection components all share a common voltage thresholding component.*

*23. The circuit of claim 17, wherein each said voltage thresholding component is external to said solid-state structure.*

*24. A method for protecting against overvoltages on an incoming pair of signal lines, comprising the steps of:*

*providing back-to-back diodes between said signal lines, each said diode having an anode and a cathode;*

*providing back-to-back thyristors between said signal lines, each said thyristor having a gate, an anode connected to said cathode of a respective one of said diodes, and a cathode connected to said anode of a respective one of said diodes; and*

*automatically activating switching elements which are connected to the gates of said thyristors, to thereby activate said thyristors, whenever threshold-voltage-setting components connected to said switching elements show that the voltage drop across one of said thyristors exceeds a threshold amount.*

*25. The method of claim 24, wherein each said threshold-voltage-setting component is a diode with a fixed breakdown voltage.*

*26. The method of claim 24, wherein said cathodes of said diodes, and said anodes of said thyristors, are all connected together to a common node.*

*27. The method of claim 24, wherein said threshold-voltage-setting components have equal breakdown voltages.*

*28. The method of claim 24, wherein said threshold-voltage-setting components have unequal breakdown voltages.*

*29. The method of claim 24, wherein said switching elements share a common threshold-voltage-setting component.*

*30. The method of claim 24, wherein said thyristors, diodes, and switching elements are all integrated together in a common solid-state structure.*

*31. The method of claim 24, wherein said thyristors, diodes, and switching elements are all integrated together in a common solid-state structure; and each said threshold-voltage-setting component is external to said solid-state structure.*

* * * * *